US012082372B2

(12) United States Patent
Agarwal et al.

(10) Patent No.: US 12,082,372 B2
(45) Date of Patent: Sep. 3, 2024

(54) METHOD, APPARATUS, AND COMPUTER PROGRAM PRODUCT FOR MULTIPHASE COOLING OF A MOBILE ELECTRONIC DEVICE

(71) Applicant: Nokia Technologies Oy, Espoo (FI)

(72) Inventors: Akshat Agarwal, Clonmagadden (IE); Ian Davis, Delgany (IE); Nicholas Jeffers, Wicklow (IE); Diarmuid O'Connell, Athy (IE); Oliver Burns, County Meath (IE)

(73) Assignee: NOKIA TECHNOLOGIES OY, Espoo (FI)

( * ) Notice: Subject to any disclaimer, the term of this patent is extended or adjusted under 35 U.S.C. 154(b) by 415 days.

(21) Appl. No.: 17/364,339

(22) Filed: Jun. 30, 2021

(65) Prior Publication Data
US 2022/0015259 A1 Jan. 13, 2022

(30) Foreign Application Priority Data
Jul. 8, 2020 (EP) .................................. 20184624

(51) Int. Cl.
*H05K 7/20* (2006.01)
*H02J 7/02* (2016.01)
(Continued)

(52) U.S. Cl.
CPC ....... *H05K 7/2029* (2013.01); *H05K 7/20281* (2013.01); *H05K 7/20381* (2013.01);
(Continued)

(58) Field of Classification Search
None
See application file for complete search history.

(56) References Cited

U.S. PATENT DOCUMENTS 6,295,819 B1 10/2001 Mathiprakasam et al.
8,395,898 B1 * 3/2013 Chamseddine ....... F28D 7/0075
361/695
(Continued)

FOREIGN PATENT DOCUMENTS

EP 3021354 A1 5/2016
EP 3185289 A1 6/2017

OTHER PUBLICATIONS

Nesarajah et al., "Thermoelectric Power Generation: Peltier Element Versus Thermoelectric Generator", 42nd Annual Conference of the IEEE Industrial Electronics Society, Oct. 23-26, 2016, pp. 4252-4257.
(Continued)

*Primary Examiner* — Carlos R Ortiz Rodriguez
(74) *Attorney, Agent, or Firm* — ALSTON & BIRD LLP (57) ABSTRACT

Methods, apparatuses, and computer program products are disclosed for providing a multiphase pumping mechanism configured for multiphase cooling of electrical charging circuitry. In the context of an apparatus, the apparatus includes a thermoelectric cooling device having first and second opposed surfaces and a fluid circulation path having first and second branches in thermal communication with the first and second surfaces, respectively, of the thermoelectric cooling device. The fluid circulation path is configured to control flow of fluid therethrough such that the fluid alternately flows through the first and second branches. The first branch of the fluid circulation path is also configured to be in a thermal communication with at least one first component of a mobile electronic device in order to absorb heat and correspondingly cool the at least one first component of the mobile electronic device.

20 Claims, 6 Drawing Sheets

(51) Int. Cl.
*H02J 50/10* (2016.01)
*H02J 50/40* (2016.01)

(52) U.S. Cl.
CPC .............. *H05K 7/2039* (2013.01); *H02J 7/02* (2013.01); *H02J 50/10* (2016.02); *H02J 50/40* (2016.02)

(56) References Cited

U.S. PATENT DOCUMENTS

| | | | |
|---|---|---|---|
| 9,445,524 B2* | 9/2016 | Lofy | H05K 7/20845 |
| 9,954,387 B2 | 4/2018 | Sultenfuss et al. | |
| 10,455,728 B2 | 10/2019 | Lofy et al. | |
| 2004/0113265 A1* | 6/2004 | DiBattista | H01L 23/473 |
| | | | 257/E23.098 |
| 2006/0044522 A1* | 3/2006 | Feliss | G03B 21/16 |
| | | | 353/122 |
| 2012/0103576 A1* | 5/2012 | Toftloekke | G06F 1/203 |
| | | | 165/104.33 |
| 2015/0094875 A1* | 4/2015 | Duzly | G06F 13/1668 |
| | | | 700/300 |
| 2015/0257303 A1 | 9/2015 | Shedd | |
| 2016/0120065 A1* | 4/2016 | Shedd | F28F 9/26 |
| | | | 165/104.29 |
| 2016/0161998 A1 | 6/2016 | Kinstle, III | |
| 2017/0185112 A1 | 6/2017 | Magi et al. | |
| 2017/0315595 A1 | 11/2017 | Kulkarni et al. | |
| 2018/0123381 A1 | 5/2018 | Sultenfuss | |

OTHER PUBLICATIONS

"Why should you shop for peltier module via AliExpress?", AliExpress, Retrieved on Jun. 22, 2021, Webpage available at : https://www.aliexpress.com/popular/peltier-module.html.

"3M™ Novec™ 7000 Engineered Fluid", 3M Novec, Technical Data, Retrieved on Jun. 22, 2021, Webpage available at : https://multimedia.3m.com/mws/media/1213720/3m-novec-7000-engineered-fluid-tds.pdf.

"Black Shark FunCooler", Black Shark, Retrieved on Jun. 23, 2021, Webpage available at : https://eu.blackshark.com/products/funcooler.

"Pop-Up Buttons AND Active Cooling ?!—Black Shark 3 Pro Durability Test!", Youtube, Retrieved on Jun. 23, 2021, Webpage available at : https://www.youtube.com/watch?v=z9SZKYxd0rk.

Extended European Search Report received for corresponding European Patent Application No. 20184624.3, dated Jan. 15, 2021, 7 pages.

* cited by examiner

METHOD, APPARATUS, AND COMPUTER PROGRAM PRODUCT FOR MULTIPHASE COOLING OF A MOBILE ELECTRONIC DEVICE

TECHNOLOGICAL FIELD

An example embodiment of the present disclosure relates generally to a method, apparatus, and computer program product to provide temperature regulation for electronic components, such as the electronic components of a mobile electronic device.

BACKGROUND

Inductive charging, or wireless charging, is a type of power transfer which eliminates the need for charging cables and ports between a battery powered user device and a power source. Wireless charging allows compatible electrical devices to be recharged merely by being placed within a predefined proximity of a compatible charger. When the compatible electrical device is within range of the compatible charger, energy is transferred by way of inductive coupling therebetween. During inductive coupling an alternating current passes through an induction coil in the charger to create a fluctuating magnetic field. The fluctuating magnetic field induces an alternating electrical current within a second induction coil embedded in the electrical device to be charged. The charging circuitry within the electrical device then converts the alternating electrical current into a direct current to charge an onboard battery.

Such methods of wireless charging for electrical devices have gained popularity recently because removal of charging cables and ports provides additional user convenience and allows for simpler design aesthetics. Moreover, without the need for charging ports, devices, such as both the wireless charger and the electrical device to be charged can be more fully sealed from potentially damaging elements such as dirt and water. However, inductive charging generates excess heat which increases as a larger amount of power is transferred over a shorter period of time. Excessive temperatures can have adverse effects on the components within electrical devices leading to device failure or other performance deficiencies. In order to manage the excess heat generated by inductive charging, the electrical device may be cooled using forced convection methods that use air as the coolant and a blower, such as an axial fan, to cause cool air to flow thereover. However, a blower not only consumes additional power during operation, but may create noise and, in some instances, may fail, thereby incurring the costs and delays associated with repair or replacement.

BRIEF SUMMARY

A method, apparatus, and computer program product are disclosed to provide for a multiphase pumping mechanism which removes heat from an electrical device during inductive charging. The multiphase pumping mechanism uses heat generated during wireless charging in order to force coolant to flow through a closed loop system, thereby extracting excess heat and cooling at least certain components of the electrical device. Since coolant moves as a result of the pressure and temperature imbalance within the closed loop system, traditional cooling pumps and fans are not required. As such the multiphase pumping mechanism provides for cooling of electrical devices without the added power consumption, heat generation, ventilation requirements, and space requirements needed for fans and pumps of traditional cooling systems.

According to an embodiment, there is provided an apparatus comprising means for alternately heating and cooling a fluid utilizing a thermoelectric cooling device having first and second opposed surfaces. Additionally, the apparatus comprises means for circulating a fluid via first and second branches in thermal communication with the first and second surfaces, respectively, of the thermoelectric cooling device. The means for circulating fluid is configured to alternately flow fluid through the first and second branches. Moreover, the first branch is configured to be in thermal communication with at least one first component of a mobile electronic device to absorb heat from, and correspondingly cool, the at least one first component of the mobile electronic device. The apparatus can further comprise means for activating the thermoelectric cooling device in an instance in which the fluid flows through the second branch and is in thermal communication with the second surface of the thermoelectric cooling device so as to absorb heat from the second surface of the thermoelectric cooling device. Additionally, the apparatus may include means for deactivating the thermoelectric cooling device in an instance in which the fluid flows through the first branch and is in thermal communication with the at least one component of the mobile electronic device. In some embodiments, the apparatus comprises means for absorbing heat from the fluid that is circulating. The apparatus of an example embodiment also includes means, positioned between the means for absorbing heat and the thermoelectric cooling device, for providing heat to be absorbed by the fluid that is circulating.

The means for circulating fluid and the means for absorbing heat may be comprised by the mobile electronic device, and, as such, the means for providing heat may comprise at least one second component of the mobile electronic device. In accordance with some such embodiments, the means for absorbing heat comprises a housing of the mobile electronic device. In some embodiments, the thermoelectric cooling device, the means for circulating fluid and the means for absorbing heat are comprised by a wireless charging device configured to charge the mobile electronic device, and, accordingly, the means for providing heat comprises at least one second component of the wireless charging device. In some embodiments, the fluid comprises a coolant, such as one or more of Novec 7000, Novec 7100, Novec 649, H2O, a non-dielectric liquid coolant, or a dielectric liquid coolant.

According to another embodiment, there is provided an apparatus comprising a thermoelectric cooling device having first and second opposed surfaces. In some embodiments, the thermoelectric cooling device further comprises one or more thermoelectric couples. The apparatus further comprises a fluid circulation path comprising first and second branches in thermal communication with the first and second surfaces, respectively, of the thermoelectric cooling device. The fluid circulation path is configured to control flow of fluid therethrough such that the fluid alternately flows through the first and second branches. Additionally, the first branch of the fluid circulation path is also configured to be in a thermal communication with at least one first component of a mobile electronic device in order to absorb heat and correspondingly cool the at least one first component of the mobile electronic device. According to some embodiments, the apparatus further comprises a controller configured to activate the thermoelectric cooling device in an instance in which the fluid flows through the second branch and is in thermal communication with the second surface of the thermoelectric cooling device so as to absorb heat from the second surface of the thermoelectric cooling device and the controller is also configured to deactivate the thermoelectric cooling device in an instance in which the fluid flows through the first branch and is in thermal communication with the at least one component of the mobile electronic device.

Moreover, the apparatus can further comprise a heat sink in thermal communication with the fluid circulation path to permit heat from the fluid to be discharged thereto. As such, the fluid circulation path is also in thermal communication with a heat source positioned between the heat sink and the thermoelectric cooling device to permit heat from the heat source to be absorbed by the fluid. In some embodiments, the thermoelectric cooling device, the fluid circulation path, and the heat sink are comprised by the mobile electronic device. Additionally, the heat source with which the fluid circulation path is in thermal communication comprises at least one second component of the mobile electronic device. In some embodiments, the heat sink comprises a housing of the mobile electronic device. In some embodiments, the fluid comprises a coolant, such as one or more of Novec 7000, Novec 7100, Novec 649, H2O, a non-dielectric liquid coolant, or a dielectric liquid coolant.

According to another embodiment, there is provided a method which comprises circulating fluid through a fluid circulation path comprising first and second branches in thermal communication with first and second opposed surfaces, respectively, of a thermoelectric cooling device. Accordingly, circulating the fluid comprises controlling flow of fluid through the fluid circulation path such that the fluid alternately flows through the first and second branches of the fluid circulation path. Moreover, the method comprises absorbing heat from at least one first component of a mobile electronic device while the fluid flows through the first branch of the fluid circulation path, thereby correspondingly cooling the at least one first component of the mobile electronic device. In some embodiments, the method further comprises activating the thermoelectric cooling device in an instance in which the fluid flows through the second branch and is in thermal communication with the second surface of the thermoelectric cooling device so as to absorb heat from the second surface of the thermoelectric cooling device. Additionally, the method can comprise deactivating the thermoelectric cooling device in an instance in which the fluid flows through the first branch and is in thermal communication with the at least one component of the mobile electronic device. Furthermore, the method comprises discharging heat from the fluid to a heat sink in thermal communication with the fluid circulation path. In some embodiments, the heat sink comprises one or more thermal pins, thermal fins, coolant baffles, or coolant bubblers.

The fluid may be further used for absorbing heat from a heat source that is also in thermal communication with the fluid circulation path and positioned between the heat sink and the thermoelectric cooling device. Accordingly, absorbing heat from the heat source comprises heating the fluid with the fluid remaining in a liquid phase. Moreover, absorbing heat from the at least one first component of the mobile electronic device comprises causing the fluid to transition to a vapor phase. Furthermore, in some embodiments, the thermoelectric cooling device, the fluid circulation path and the heat sink are comprised by the mobile electronic device, and as such the heat source with which the fluid circulation path is in thermal communication comprises at least one second component of the mobile electronic device. In some such embodiments, the heat sink comprises a housing of the mobile electronic device. In some embodiments, the thermoelectric cooling device, the fluid circulation path, and the heat sink are comprised by a wireless charging device. The wireless charging device is configured to charge the mobile electronic device and, accordingly, the heat source with which the fluid circulation path is in thermal communication comprises at least one second component of the wireless charging device. In some embodiments, the wireless charging device is configured for inductive wireless charging.

According to another embodiment, there is provided a computer program product comprising a non-transitory computer readable storage medium having program code portions stored thereon with the program code portions configured, upon execution, to cause an apparatus to carry out various processes including causing a thermoelectric cooling device to be activated in an instance in which a fluid flows through a second branch of a fluid circulation path having first and second branches in thermal communication with first and second surfaces, respectively, of the thermoelectric cooling device. Additionally, the fluid circulation path is configured to control flow of fluid therethrough such that the fluid alternately flows through the first and second branches. Moreover, the activation of the thermoelectric cooling device causes the fluid within the second branch of the fluid circulation path to absorb heat from the thermoelectric cooling device. The program code portions are further configured, upon execution, to cause an apparatus to cause the thermoelectric cooling device to be deactivated in an instance in which the fluid flows through the first branch. The first branch of the fluid circulation path is in thermal communication with at least one component of a mobile electronic device such that the fluid absorbs heat from the at least one component while the thermoelectric cooling device is deactivated.

In some embodiments, the program code portions that are configured to cause the thermoelectric cooling device to be activated further comprise program code portions to cause the thermoelectric cooling device to be activated so as to cause the fluid within the second branch of the fluid circulation path to absorb heat from the thermoelectric cooling device sufficient to cause the fluid to transition from a liquid state to a vapor phase. In some embodiments, the program code portions that are configured to cause the thermoelectric cooling device to be deactivated further comprise program code portions to cause the thermoelectric cooling device to be deactivated while heat from the at least one component of the mobile electronic device is absorbed by the fluid within the first branch of the fluid circulation path that is sufficient to cause the fluid to transition from a liquid state to a vapor phase. In some embodiments, the thermoelectric cooling device and the fluid circulation path are comprised by the mobile electronic device or by a wireless charging device.

Various other aspects are also described in the following detailed description and in the attached claims.

BRIEF DESCRIPTION OF THE DRAWINGS

Having thus described embodiments of the disclosure in general terms, reference will now be made to the accompanying drawings, which are not necessarily drawn to scale, and wherein:

DETAILED DESCRIPTION

Some embodiments of the present invention will now be described more fully hereinafter with reference to the accompanying drawings, in which some, but not all, embodiments of the invention are shown. Indeed, various embodiments of the invention can be embodied in many different forms and should not be construed as limited to the embodiments set forth herein; rather, these embodiments are provided so that this disclosure will satisfy applicable legal requirements. The term "or" is used herein in both the alternative and conjunctive sense, unless otherwise indicated. The terms "illustrative" and "exemplary" are used to be examples with no indication of quality level. Like reference numerals refer to like elements throughout. As used herein, the terms "data," "content," "information," and similar terms can be used interchangeably to refer to data capable of being transmitted, received and/or stored in accordance with embodiments of the present invention. Thus, use of any such terms should not be taken to limit the spirit and scope of embodiments of the present invention.

Additionally, as used herein, the term "circuitry" refers to (a) hardware-only circuit implementations (e.g., implementations in analog circuitry and/or digital circuitry); (b) combinations of circuits and computer program product(s) comprising software and/or firmware instructions stored on one or more computer readable memories that work together to cause an apparatus to perform one or more functions described herein; and (c) circuits, such as, for example, a microprocessor(s) or a portion of a microprocessor(s), that require software or firmware for operation even if the software or firmware is not physically present. This definition of 'circuitry' applies to all uses of this term herein, including in any claims. As a further example, as used herein, the term 'circuitry' also includes an implementation comprising one or more processors and/or portion(s) thereof and accompanying software and/or firmware. Moreover, two sets of circuitries may both leverage use of the same processor, network interface, storage medium, the like, or combinations thereof in order to perform their associated functions, such that duplicate hardware is not required for each set of circuitries.

As defined herein, a "computer-readable storage medium," which refers to a non-transitory physical storage medium (e.g., volatile or non-volatile memory device), can be differentiated from a "computer-readable transmission medium," which refers to an electromagnetic signal. Such a medium can take many forms, including, but not limited to a non-transitory computer-readable storage medium (e.g., non-volatile media, volatile media), and transmission media. Transmission media include, for example, coaxial cables, copper wire, fiber optic cables, and carrier waves that travel through space without wires or cables, such as acoustic waves and electromagnetic waves, including radio, optical and infrared waves. Signals include man-made transient variations in amplitude, frequency, phase, polarization or other physical properties transmitted through the transmission media. Examples of non-transitory computer-readable media include a magnetic computer readable medium (e.g., a floppy disk, hard disk, magnetic tape, any other magnetic medium), an optical computer readable medium (e.g., a compact disc read only memory (CD-ROM), a digital versatile disc (DVD), a Blu-Ray disc, or the like), a random access memory (RAM), a programmable read only memory (PROM), an erasable programmable read only memory (EPROM), a FLASH-EPROM, or any other non-transitory medium from which a computer can read. The term computer-readable storage medium is used herein to refer to any computer-readable medium except transmission media. However, it will be appreciated that where embodiments are described to use a computer-readable storage medium, other types of computer-readable mediums can be substituted for or used in addition to the computer-readable storage medium in alternative embodiments.

Additionally, as used herein, the terms "thermoelectric cooling module," "thermoelectric cooling device," or similar terms refer to a solid-state heat pump, such as a Peltier module, comprising at least a thermoelectric couple, which transfers heat from one surface to another surface. The heat transfer is caused by the consumption of electrical current by the thermoelectric couple. The direction of the heat transfer across the device is dependent on the direction of the current flow through the thermoelectric couple, which is controlled by thermoelectric cooling circuitry that may leverage additional circuitry to control the current flow. Additionally, the magnitude of the heat transfer across the thermoelectric couple may be controlled by the magnitude of the current flowing through the thermoelectric couple which may be further controlled by one or more logic circuits.

Thus, use of any such terms should not be taken to limit the spirit and scope of embodiments of the present disclosure.

A method, apparatus and computer program product are provided in order to employ a multiphase pumping mechanism in order to cool at least one component of a mobile electronic device. As described below, the apparatus of an example embodiment may be embodied by the mobile electronic device. Alternatively, the apparatus of another example embodiment may be external to, but in thermal communication with the mobile electronic device, such as by being proximate to, e.g., in contact with, the mobile electronic device. In this alternative embodiment, the apparatus may be embodied, for example, by a wireless charging device that is configured to wirelessly charge a mobile electronic device.

Figure 1:
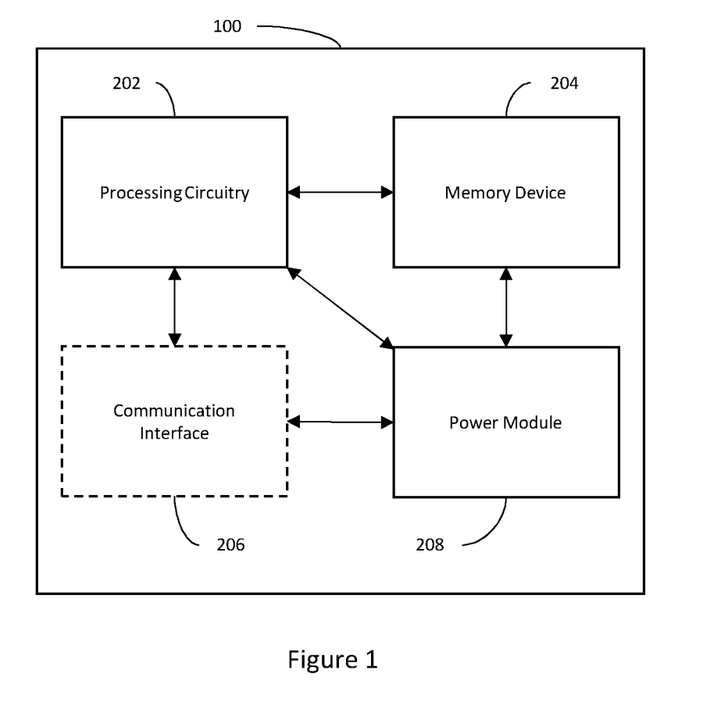
FIG. 1 illustrates an example architecture for at least some embodiments of user equipment that can implement a multiphase pumping mechanism.

Referring now to FIG. 1, an example embodiment of a mobile electronic device 100 that can implement a multiphase pumping mechanism is illustrated. The multiphase pumping mechanism may be implemented to achieve cooling effects within any of a plurality of different types of mobile electronic devices during any of a wide range of operations undertaken by a particular mobile electronic device. For example, the multiphase pumping mechanism may be used to dissipate heat generated during one or more of power consumption of a mobile electronic device, charging of a mobile electronic device (e.g., wireless inductive charging, corded charging, etc.), and/or during the performance of other operations. By way of example, the mobile electronic device may be one or more of a laptop computer, desktop computer, server, smartphone, mobile telephone, camera, peripheral device (e.g., speakers, mouse, keyboard, printer, scanner, monitor, etc.), lighting apparatus (e.g., flashlight, lamp, etc.), headphones, transportation vehicle (e.g., car, electric scooter, electric skateboard, etc.), power tools (e.g., power drill, etc.), electrical appliances (e.g., blender, etc.), the like, or combination thereof.

In an example embodiment, the multiphase pumping mechanism may be implemented internally or externally to a battery and/or charging module associated with any of the aforementioned types of mobile electronic devices 100. As described below, at least a portion of the multiphase pumping mechanism, such as the fluid, e.g., coolant, within a fluid circulation path, is in thermal communication with a least one component of the mobile electronic device, such as a battery of the mobile electronic device, one or more electronic components of the mobile electronic device or the like, to receive thermal energy therefrom.

As shown, FIG. 1 further illustrates an example architecture for an embodiment of the mobile electronic device 100 that can implement the multiphase pumping mechanism. In the example illustrated by FIG. 1, the mobile electronic device 100 comprises a processing circuitry 202, a memory device 204, and a power module 208. The processing circuitry 202 may comprise a processor, and/or co-processor(s) or any other circuitry assisting or otherwise associated with the processor, that may be in communication with any other component(s) of user equipment 100 via a bus for passing information therethrough. For example, the processing circuitry 202 can be embodied as one or more of various hardware processing means such as a processor, a coprocessor, a microprocessor, a controller, a digital signal processor (DSP), a processing element with or without an accompanying DSP, or various other circuitry including integrated circuits such as, for example, an application specific integrated circuit (ASIC), an field programmable gate array (FPGA), a microcontroller unit (MCU), a hardware accelerator, a special-purpose computer chip, the like, or combinations thereof. As such, in some embodiments, the processing circuitry 202 can include one or more processing cores configured to perform independently. A multi-core processor can enable multiprocessing within a single physical package. Additionally, the processing circuitry 202 can include one or more processors configured in tandem via the bus to enable independent execution of instructions, pipelining and/or multithreading. As described below, the processing circuitry 202 of an example embodiment comprises and/or serves as a controller.

In an example embodiment, the processing circuitry 202, such as a processor in an embodiment in which the processing circuitry is comprised of one or more processors, can be configured to execute instructions stored in the memory device 204 or otherwise accessible to the processor. Alternatively or additionally, the processor can be configured to execute hard coded functionality. As such, whether configured by hardware or software methods, or by a combination thereof, the processor can represent an entity (e.g., physically embodied in circuitry) capable of performing operations according to an embodiment of the present disclosure while configured accordingly.

Thus, for example, when the processor is embodied as an ASIC, FPGA, or the like, the processor can be specifically configured hardware for conducting the operations described herein. Alternatively, as another example, when the processor is embodied as an executor of instructions, the instructions can specifically configure the processor to perform the algorithms and/or operations described herein when the instructions are executed. However, in some cases, the processor can be a processor of a specific device (e.g., an encoder and/or a decoder, etc.) configured to employ an embodiment of the present disclosure by further configuration of the processor by instructions for performing the algorithms and/or operations described herein. The processor can include, among other things, a clock (e.g., clock generator 504), an arithmetic logic unit (ALU), and logic gates configured to support operation of the processor.

In some embodiments, any one or more components or subsystems of the mobile electronic device 100 can be embodied as a chip or chip set. In other words, the processing circuitry 202, the memory device 204, the power module 208, the like, or combinations thereof can comprise one or more physical packages (e.g., chips, etc.) including materials, components and/or wires on a structural assembly (e.g., a baseboard, a wafer, etc.). The structural assembly can provide physical strength, conservation of size, and/or limitation of electrical interaction for component circuitry included thereon. Subsystems of mobile electronic device 100 can therefore, in some cases, be configured to implement an embodiment on a single chip or as a single "system on a chip." As such, in some embodiments, a chip, chipset, integrated circuit, the like, or combinations thereof can constitute means for performing one or more operations for providing at least the particular functionalities described herein.

In some embodiments, the processing circuitry 202 may be in communication with the memory device 204 via a bus for passing information among components of the user equipment 100. The memory device may be non-transitory and may include, for example, one or more volatile and/or non-volatile memories. In other words, for example, the memory device may be an electronic storage device (e.g., a computer readable storage medium) comprising gates configured to store data (e.g., bits) that may be retrievable by a machine (e.g., a computing device like the processing circuitry). The memory device may be configured to store information, data, content, applications, instructions, or the like for enabling the apparatus to carry out various functions in accordance with an example embodiment of the present disclosure. For example, the memory device could be configured to buffer input data for processing by the processing circuitry. Additionally or alternatively, the memory device could be configured to store instructions for execution by the processing circuitry.

In some embodiments, the processing circuitry 202 may be in communication with the power module 208 either directly, or by way of the memory device 204, via a bus for passing information among components of the mobile electronic device 100. According to some embodiments, the power module 208 may comprise wireless charging coils and associated circuitry configured to, with at least the processing circuitry, transfer electrical energy received via the wireless charging coils from an external charging apparatus, e.g., a wireless charger, during charging operations to a battery associated with the mobile electronic device 100. In some embodiments, the power module 208 may be configured to direct electrical current to a battery associated with the mobile electronic device 100 such that the battery is charged. The power module 208 may be configured to charge a battery of a predefined size and/or type (e.g., lead-acid, nickel-cadmium, lithium-ion, etc.) or the power module 208 may be configured to programmatically adjust the charging criteria in accordance with a plurality of battery sizes and/or types. For example, in some embodiments the mobile electronic device 100 may accept both nickel-cadmium and lithium-ion batteries. In such an embodiment, the power module 208 may detect the battery type and/or battery size and, in response, adjust the electrical current directed to the detected battery and/or adjust the time required for the detected battery to be fully charged. Additionally, the power module 208 may receive an input defining the battery type and/or battery size, such as via a user interface or communication interface. Further, some embodiments of the power module 208 may interface with an external charging apparatus which comprises corresponding wireless charging coils and optionally at least some of the features described herein with respect to the power module 208.

Moreover, in some embodiments, the mobile electronic device 100 may further comprise one or more additional modules configured to perform a particular function (e.g., a user interface, communication interface, global positioning system (GPS) module, etc.). As depicted by FIG. 1, the mobile electronic device 100 can further include, for example, a communication interface 206 that can be any means such as a communication device or communication circuitry embodied in either hardware or a combination of hardware and software that is configured to receive and/or transmit data from or to one or more network devices via one or more networks. Additionally, in some embodiments, the communication interface 206 may be configured to directly receive and/or transmit data from or to one or more devices external to mobile electronic device 100. In this regard, the communication interface can include, for example, one or more antennas and supporting hardware and/or software for enabling communications with a wireless communication network (e.g., Bluetooth, Wi-Fi, etc.). Additionally or alternatively, the communication interface can include the circuitry for interacting with the one or more antennas to cause transmission of signals via the antenna(s) or to handle receipt of signals received via the one or more antennas. In some environments, the communication interface can alternatively or also support wired communication. As such, for example, the communication interface can include a communication modem and/or other hardware/software for supporting communication via cable, Digital Subscriber Line (DSL), Universal Serial Bus (USB) or other mechanisms. In some embodiments, the communication interface can include a transmitter and a receiver. In some embodiments, the processing circuitry 202 can be configured to control the functioning of communication interface 206, at least in part, any of the components or sub-subsystem therein, or may be further configured to control the functioning of one or more other subsystems (not shown) of the mobile electronic device 100. In some embodiments, the processing circuitry 202 can be configured to control the functioning of the transmitter and receiver by effecting control signaling via electrical leads to the transmitter and receiver.

Figure 2:
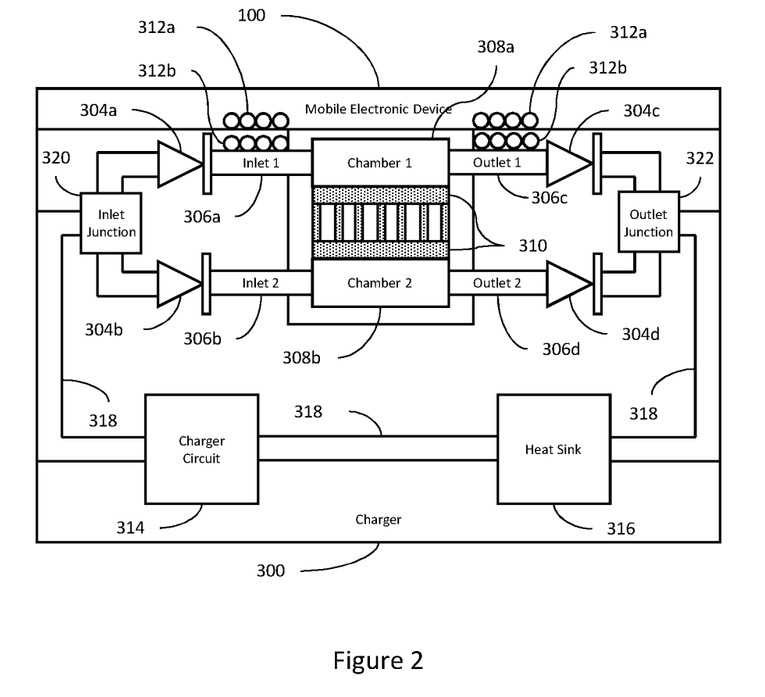
FIG. 2 illustrates an example embodiment of a multiphase pumping mechanism.

Referring now to FIG. 2, an example architecture of an apparatus that provides a multiphase pumping mechanism in accordance with an example embodiment is illustrated. Although the apparatus may be embodied by a mobile electronic device 100 as described in more detail below, the apparatus of FIG. 2 is embodied by a device, such as a charging apparatus (e.g., charger 300, such as a charging mat), that is configured to charge a mobile electronic device and to concurrently withdraw heat from at least one component of the mobile electronic device (e.g., a smart phone, etc.). According to the example architecture, mobile electronic device 100 and the associated charger 300 each comprises a respective set of inductive charging coils 312a, 312b. Additionally, as illustrated, the inductive charging coils 312a associated with mobile electronic device 100 are proximate to the inductive charging coils 312b associated with charger 300 such that two inductive charging coil sets are configured to be within a functional distance to each other, such as within the electromagnetic field generated by the other. The functional distance described with respect to the inductive charging coils 312a, 312b may vary, or be defined according to various factors including, but not limited to, one or more of the type of mobile electronic device 100 and/or charger 300, the size and/or shape of the inductive charging coils 312a, 312b, the battery associated with mobile electronic device 100, the power source supplying power to charger 300 (e.g., wall socket, solar panel, etc.), circuitry associated with power module 208, or the like, or combinations thereof. For example, the functional distance may be substantially small such that one or more components of the mobile electronic device 100 (e.g., a phone case, etc.) are in contact with one or more components of charger 300 (e.g., a charging mat, etc.) in order to facilitate both charging of the mobile electronic device and the withdrawal of heat from the mobile electronic device.

In some embodiments, the functional distance may be any distance between inductive charging coils 312a and 312b such that both sets of inductive charging coils are in proximity to at least one shared magnetic field (not shown). In this regard, the inductive charging coils 312a associated with the mobile electronic device 100 may be configured to be disposed within a magnetic field generated and/or transmitted by inductive charging coils 312b associated with charger 300, such that an electrical current is created in the inductive charging coils 312a that is directed to one or more components of the mobile electronic device 100 (e.g., power module 208) in order to charge the battery. In such embodiments, inductive charging coils 312a may be referred to as the receiver coil while inductive charging coils 312b may be referred to as the transmitter coil.

As further illustrated by FIG. 2, the apparatus may also include a thermoelectric cooling (TEC) device 310, which is embodied by the wireless charger 300 in the illustrated embodiment, but which may alternatively be embodied by the mobile electronic device 100 in other embodiments described below. The TEC device 310 is a solid-state heat pump, such as a Peltier module, comprising at least a thermoelectric couple having opposed first and second surfaces and, upon activation, operating so as to transfer heat from one surface to another surface. The heat transfer is responsive to an electrical current that is directed to the thermoelectric couple with the direction of the heat transfer across the TEC device 310 being dependent on the direction of the current flow through the thermoelectric couple, such as the polarity of the electrical current. Additionally, the magnitude of the heat transfer across the thermoelectric couple may be controlled by the magnitude of the electrical current provided to the thermoelectric couple.

In the embodiment of FIG. 2, the inductive charging coils 312b may be situated on either side of the TEC device 310. In some embodiments, inductive charging coils 312b may be configured into a circular or other closed shape such that the inductive charging coils 312b wrap around the TEC device 310.

As also shown in FIG. 2 and as described below, the TEC device 310 includes opposed first and second surfaces that contact or are otherwise in thermal communication with first and second branches 308a, 308b of a fluid circulation path defined by the apparatus of an example embodiment. While the fluid circulation path may be defined in various manners, the fluid circulation path of one embodiment is comprised of tubing, such as one or more tubes formed of a thermally conductive material, e.g., copper, through which a fluid, that is, a coolant, flows. Alternatively, the fluid circulation path may be comprised of one or more pipes, ducts, conduits, channel, or the like, or combinations thereof. Although the first and second branches may have different configurations, the first branch 308a of the illustrated embodiment includes a chamber proximate to and in thermal communication with a first surface of the TEC device 310 and an inlet 306a and an outlet 306c to direct fluid into and out of the chamber, respectively. As shown, the first branch 308a is also in thermal communication with the mobile electronic device 100, such as at least one first component of the mobile electronic device. Similarly, the second branch 308b of the illustrated embodiment includes a chamber proximate to and in thermal communication with an opposed, second surface of the TEC device 310 and an inlet 306b and an outlet 306d to direct fluid into and out of the chamber, respectively.

In order to control the electrical current directed to the thermoelectric couple, the TEC device 310 may include or otherwise be in communication with additional circuitry (e.g., a controller embodied, for example, by processing circuitry 202, etc.) such that the TEC device 310 can be activated or deactivated in response to a received input signal. Although the controller may be responsive to input provided by a user interface, a communication interface 206 or the like, in order to selectively activate or deactivate the TEC device, the controller of an example embodiment is responsive to signals provided by one or more sensors associated with charger 300 and/or the mobile electronic device 100 (e.g., a thermocouple, thermistor, pressure sensor, photoelectric sensor, etc.), or the like, or combinations thereof, as described below. As described below, the TEC device 310 of an example embodiment is configured to be cycled on and off during particular stages of a process (e.g., an inductive charging process, etc.) in response to control signals from the controller which, in turn, may be responsive to the signals provided by one or more sensors. Additionally, the TEC device 310 may be configured to provide heat transfer (e.g., heating or cooling effects) to the fluid within the first and/or second branches 308a, 308b of the fluid communication path such that the heat transfer between the TEC device 310 and the fluid within the first and second branches 308a, 308b is proportional, disproportional, or inversely proportional, to the coolant flow through, or coolant volume in, the first and second branches 308a, 308b.

By way of a nonlimiting example, in an instance in which the second branch 308b is filled with fluid, the TEC device 310 may provide energy, in the form of heat, to the fluid within the second branch 308b with the energy being provided by the TEC device 310 being less than or equal to the maximum heat output of the TEC device 310. By way of another nonlimiting example, in an instance in which fluid is flowing out of the second branch 308b at a substantially increasing rate, the TEC device 310 may provide energy, in the form of heat, to the fluid within the second branch 308b such that the energy provided by the TEC device 310 is substantially decreasing proportional to the fluid flow rate. In such examples, the quantity and/or flow rate of fluid in the second branch 308b may be detected by way of one or more sensors such as a digital flow sensor, liquid volume sensor, pressure sensor, or the like, or combinations thereof.

According to additional embodiments, although only a single TEC device 310 is depicted, the TEC device can comprise two or more separate thermoelectric couples. In some such embodiments, a plurality of thermoelectric couples are configured to be in thermal communication with each other and some of the thermoelectric couples are configured to be in thermal communication with at least one other component of the multiphase pumping mechanism, such as the first and second branches 308a, 308b of the fluid circulation path. For example, the TEC device 310 may comprise a stack of thermoelectric couples configured in series, or parallel, with each other such that heat transfer occurs across the stack of thermoelectric couples from at least a first surface of a first thermoelectric couple through the stack of thermoelectric couples to an opposed second surface of at least a second thermoelectric couple.

As indicated above, a fluid circulates through the fluid circulation path. The fluid comprises a coolant capable of existing in at least the liquid and vapor phases at the pressures that are maintained within the fluid circulation path. In some embodiments, the coolant comprises one or more of Novec 7000, Novec 7100, Novec 649, $H_2O$, a non-dielectric liquid coolant, a dielectric liquid coolant, or the like, or combinations thereof. Additionally, the dielectric liquid coolant may comprise one or more of ethylene glycol, propylene glycol, methanol, ethanol, mineral oil, liquid oxygen, liquid nitrogen, liquid helium, liquid argon, the like or combinations thereof. As a result of its circulation through the fluid circulation path, the coolant is in thermal communication with one or more components of the mobile electronic device 100 and, in some embodiments, also in thermal communication with one or more components, such as the electrical circuitry, of a device external to the mobile electronic device, such as the charger 300.

As noted above, the first branch 308a of the fluid circulation path of one example embodiment includes a chamber that is proximate to and in thermal communication with the TEC device 310, such as the first surface of the TEC device. The first branch of the illustrated embodiment also includes an inlet 306a through which fluid enters the chamber and an outlet 306c through which fluid exits the first holding vessel. Valves, such as inlet check values 304a, 304c, are positioned upstream of the inlet 306a and downstream of the outlet 306c in order to control the flow of fluid through the first branch. Likewise, the second branch 308b of the fluid circulation path of the embodiment of FIG. 2 includes a chamber that is also proximate to and in thermal communication with the TEC device 310, such as the second surface of the TEC device. As noted above, the second branch of the illustrated embodiment also includes an inlet 306b through which fluid enters the chamber and an outlet 306d through which fluid exits the chamber. Valves, such as outlet check values 304b, 304d, are positioned upstream of the inlet 306b and downstream of the outlet 306d in order to control the flow of fluid through the second branch.

The valves, such as the check valves, generally limit the fluid flow to one direction, such as left to right in the orientation of FIG. 2 and, as a result, prevent fluid flow in the opposite direction. Even in the direction in which fluid flow is permitted, the valves, such as the check valves, may be configured to only allow fluid flow in an instance in which the pressure differential on opposite sides of the respective check valve satisfies, such as by equaling or exceeding, a predefined threshold. In some embodiments, outlet check valves 304c, 304d downstream of the respective outlets 306c, 306d may be configured to allow coolant to flow out of their respective branches in proportion to a difference in pressure on opposite sides of the respective outlet check valves 304c, 304d.

The fluid circulation path of the illustrated embodiment includes an outlet junction 322 to receive the coolant that flows through the outlet check valves 304c, 304d. In this example embodiment, the outlet check valves 304c, 304d are configured to only allow for coolant to flow from a respective one of the first and second branches to the outlet junction 322 and to prevent expanding coolant, in gas or liquid form, from the outlet junction 322 from entering the first or second branches via the outlet check valves 304c, 304d. From the outlet junction 322, the fluid circulation path 318 is further configured to connect to, or pass through, at least partially, a heat sink 316 such that the fluid circulation path 318 and the heat sink 316 are in thermal communication.

The heat sink 316 may be embodied in any of a variety of different manners. For example, the heat sink may include a dedicated heat sink formed of a thermally conductive material or a heat sink that is also configured to perform one or more other functions, such as a thermally conductive surface (e.g., an aluminum electronics housing, a phone case, etc.) from which heat can dissipate.

The heat sink of some embodiments may include the surrounding environment (e.g., air substantially at room temperature, etc.) and, in these embodiments the heat sink may also optionally include a fan or other air mover for forcing air to circulate over the fluid circulation path 318 so as to extract heat from the coolant circulating therethrough. Regardless of the manner in which the heat sink is configured, the coolant within the fluid circulation path is in thermal communication with the heat sink such that heat is transferred from the coolant to the heat sink and then dispersed, such as to the surrounding environment.

It should be appreciated that any of the embodiments of heat sink 316 presented herein may be further configured to maximize, or otherwise regulate, heat transferred out of the coolant to the surrounding environment. For example, particular components of an example embodiment of heat sink 316 may be designed to increase the surface area presented to an external environment. Additionally, an example embodiment of the heat sink 316 may be configured to regulate heat transferred out of the coolant in the fluid circulation path, such that heat removed from the coolant is limited so as to maintain one or more coolant characteristics (e.g., viscosity, flow rate, pressure, volume, etc.).

In some embodiments, heat sink 316 may be formed of one or more of heat conductive materials (e.g., metalloids, alloys, silver, copper, the like, or combinations thereof), serpentine tubes, conductive compounds, thermal/electrical insulated materials, a thermal coil (e.g., a heating coil, cooling coil, etc.), a series of thermal pins, a series of thermal fins, a coolant baffle, a coolant bubbler, or the like, or combinations thereof. Furthermore, one or more portions of the heat sink may utilize one or more of convection, conduction, radiation, or the like, or combinations thereof in order to dissipate the heat.

Regardless of the configuration of the heat sink 316, the heat sink absorbs heat from the coolant circulating through the fluid circulation path 318 and cools the coolant, thereby lowering the temperature of the coolant. In an instance in which the coolant is in vapor form, the heat sink 316 removes sufficient heat from the coolant to return the coolant to liquid form at a lower temperature.

Alternatively, in an instance in which the coolant is in a liquid form, the heat sink 316 reduces the temperature of the coolant.

FIG. 2 further illustrates that the fluid circulation path 318 that is in thermal communication with the heat sink 316 is also in thermal communication with and, in some embodiments, is in physical contact with one or more electronic components 314 (e.g., a battery, a transformer, etc.). The electronic component(s) 314 may be part of any of various devices. In the illustrated example in which a wireless charger 300 defines the fluid circulation path 318, the one or more electronic components 314 are components of the charger 300, such as a charger circuit. In other embodiments, the one or more electronic components 314 may be components of the mobile electronic device 100 as described below, or another device. In some embodiments, the portion of the fluid circulation path portion 318 proximate the one or more electronic components 314 may at least partially conform to the shape and/or size of the one or more electronic components (e.g., configured to extend along the total width and/or length of a battery, configured to coil around a cylindrical component, configured in a serpentine shape, etc.) in order to facilitate heat transfer from the one or more electronic components. As the coolant circulating through the fluid circulation path 318 is desirably capable of absorbing heat from the one or more electronic components, the portion of the fluid circulation path that is proximate the one or more electronic components may be downstream of the portion of the fluid circulation path that is proximate the heat sink 316 in at least some embodiments. Thus, the coolant circulating through the fluid circulation path 318 may discharge heat to the heat sink 316 in order to lower the temperature of the coolant so as to thereafter have additional thermal capacity to absorb heat from the one or more electronic components 314.

As also illustrated in FIG. 2, the fluid circulation path 318 of the example embodiment also includes inlet junction 320, downstream of the heat sink 316 and the one or more electronic components 314. Inlet junction 320 serves to deliver the coolant flowing through the fluid circulation path 318 to the valves, such as inlet check valves 304a, 304b that control access to the first and second branches 308a, 308b, respectively, depending upon the pressure differential on opposite sides of the respective inlet check valves 304a, 304b. As described below, the pressure differential on opposite sides of the inlet check valves 304a, 304b is typically such that the fluid alternately flows through the first and second branches, e.g., the fluid flows through the first branch, but not the second branch before recirculating through the remainder of the fluid circulation path and then flowing through the second branch.

Although operation of the multiphase pumping mechanism is described below, it is noted that heat is extracted from the mobile electronic device 100, such as from at least a first component of the mobile electronic device, by the coolant within the first branch 308a with at least some of the heat then being transferred to the heat sink 316 prior to absorbing heat from at least one electronic component 314 and then repeating the process. As a result, the multiphase pumping mechanism serves to cool both the mobile electronic device 100, such as at least a first component of the mobile electronic device, as well as the at least one electronic component. As also described below, the absorption of heat by the coolant also serves to provide the motive force to pump the coolant about the fluid circulation path 318, thereby eliminating or reducing the need for a separate pump to circulate the coolant.

Moreover, as illustrated by FIG. 2, the multiphase pumping mechanism, according to some embodiments, operates in accordance with a closed loop system for coolant to flow through. According to some other embodiments, the multiphase pumping mechanism can further comprise one or more of pressure release valves (not shown), bypass valves (not shown), coolant bleeder values (not shown), coolant reservoirs (not shown), analog/digital gauges (not shown), or the like, or combinations thereof. For example, coolant may be added to the system via a coolant reservoir in response to low coolant levels and/or low pressure readings from an array of electronic sensors (e.g., digital gauges).

Furthermore, any of the aforementioned components can be configured, in accordance with some embodiments, to produce an open loop multiphase pumping mechanism such that coolant can be added to and/or removed from the system (e.g., old coolant is removed and replaced with new coolant, one type of coolant is replaced with another type of coolant, coolant is configured to at least partially evaporate and be periodically replaced, etc.).

Figure 3:
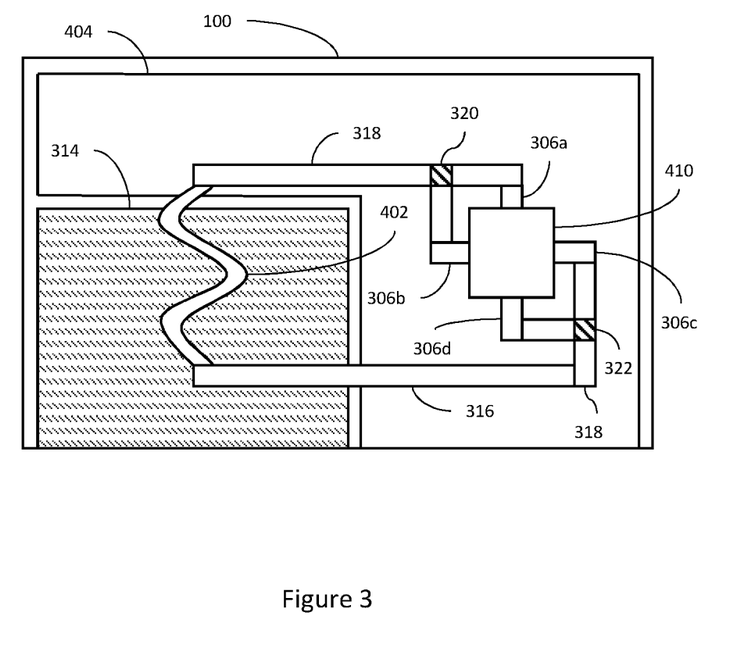
FIG. 3 illustrates a fragmentary plan view of a multiphase pumping mechanism as embodied by a mobile electronic device in accordance with an example embodiment.
Figure 4:
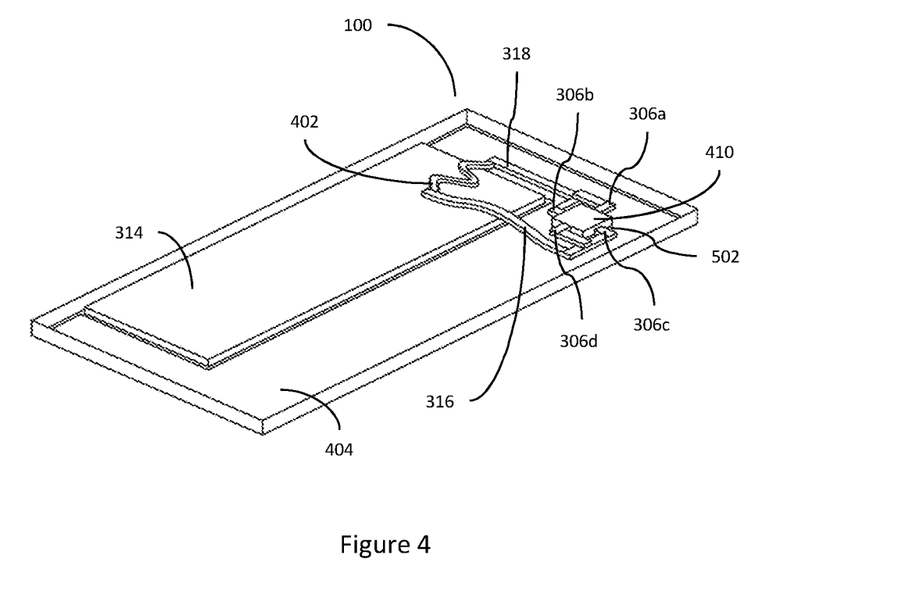
FIG. 4 illustrates a perspective view of a multiphase pumping mechanism as embodied by a mobile electronic device in accordance with an example embodiment.
Figure 5:
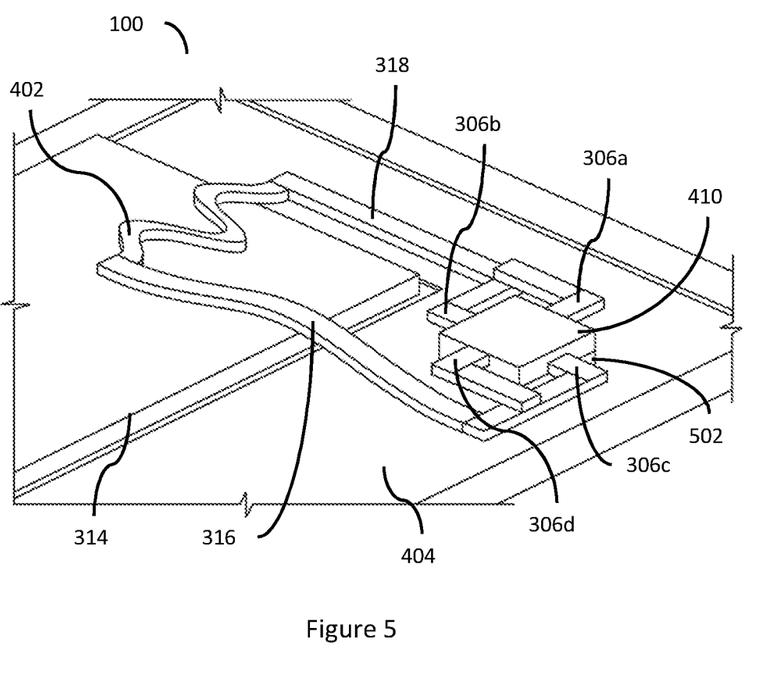
FIG. 5 illustrates a fragmentary perspective view of the multiphase pumping mechanism of FIG. 4.

With reference now to FIG. 3, another example embodiment of a multiphase pumping mechanism will be described. FIG. 3 illustrates the interior of a mobile electronic device 100 (e.g., smart phone, tablet computer, etc.) of an example embodiment. The mobile electronic device comprises at least a battery 314 and a printed circuit board (PCB) 404. In some embodiments, PCB 404 is configured to comprise one or more electronic components (e.g., resistors, processors, integrated circuits, or the like, or combinations thereof) of which at least one of the one or more electronic components generates energy in the form of heat. As depicted by FIG. 3, the TEC device 410, which may be embodied as a thermoelectric couple stack, is positioned proximate to a portion of PCB 404. In some embodiments, the TEC device 410 may be positioned on PCB 404 such that the TEC device 410 is in thermal communication with, such as by at least partially contacting, an electronic component that is to be cooled. The relationship of the TEC device and the PCB is depicted by way of example and the TEC device may, instead, be in thermal communication with other electronic components, such as discrete electronic components, in addition to or instead of the PCB in other embodiments. A further example embodiment is depicted in FIGS. 4 and 5 in which a TEC device 410 is in thermal communication with, such as by being positioned proximate electronic component 502. In any of the foregoing embodiments, the one or more electronic components with which the TEC device 410 is in thermal communication may be any desired electronic component(s) such as the electronic component(s) that produce the most heat, the electronic component(s) whose performance is most significantly impacted by heat or the like.

As described below, the apparatus of the embodiments of FIGS. 3-5 also includes a fluid circulation path 318 through which coolant circulates. Like the embodiment described with respect to FIG. 2, the fluid circulation path 318 of FIGS. 3-5 is in thermal communication with the electronic component of the mobile electronic device 100 and the TEC device 410 as well as a heat sink and optionally one or more other electronic devices. Thus, the heat produced by the one or more electronic component(s) associated with mobile electronic device 100 is at least partially transferred to and heats the coolant circulating through the fluid circulation path, thereby drawing heat from and cooling the mobile electronic device. The heat absorbed by the fluid causes the fluid to expand and to flow through the outlet check valve and about the fluid circulation path during which at least some of the heat is discharged, such as to a heat sink, as described below.

Figure 6:
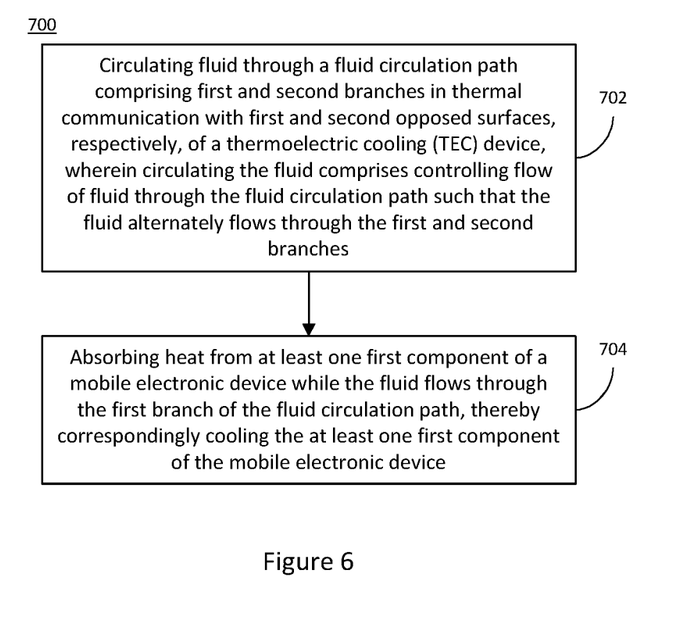
FIG. 6 is a flowchart illustrating the operations performed, such as by an apparatus utilizing a multiphase pumping mechanism, in accordance with an example embodiment.

FIG. 6 illustrates a flowchart that describes a multiphase cooling process 700. At block 702, an apparatus includes means, such as a TEC device 410 or the like, for circulating fluid (e.g., a coolant) through a fluid circulation path 318 comprising first and second branches 308a, 308b in thermal communication with first and second opposed surfaces, respectively, of the TEC device. As a result of the thermal communication between the first and second branches 308a, 308b of the fluid circulation path 318 and the opposed surfaces of the TEC device 410, the apparatus also includes means, such as the TEC device or the like, for alternately heating and cooling the fluid.

With respect to the circulation of the fluid, the apparatus of an example embodiment includes means, such as the TEC device 410, the valves, such as the check valves 304, or the like, for controlling the flow of coolant through the fluid circulation path 318 such that the coolant alternately flows through the first and second branches 308a, 308b. In some embodiments, the means for controlling the flow of the fluid comprises means, such as the valves, such as the check valves 304, the fluid circulation path 318 or the like, for restricting the direction of the flow, increasing or decreasing the velocity of the flow (e.g., by narrowing or widening a portion of the fluid circulation path, respectively), and/or causing the fluid to flow such that the fluid flow is laminar and/or turbulent. The apparatus, at block 704, also includes means, such as the coolant or the like, for absorbing heat from at least one first component of a mobile electronic device 100 while the coolant flows through the first branch 308a of the fluid circulation path 318, thereby correspondingly cooling the at least one first component of the mobile electronic device. While the coolant is in the first branch 308a, the TEC device 410 may be deactivated with the heating of the fluid provided by the heat transferred from the at least one first component.

In order to facilitate pumping of the coolant about the fluid circulation path 318, the apparatus also includes means, such as the controller as embodied by the processing circuitry 202, program code portions executed by the controller or the like, for alternately activating and deactivating the TEC device 410. In this regard, the controller may be configured to activate the TEC device 410 while the coolant is in the second branch 308b and is in thermal communication with the second surface of the TEC device. As such, even though the fluid is not in thermal communication with the at least one first component while in the second branch 308b, the fluid is heated by the second surface of the TEC device 410. In this regard, the pressure is increased to such an extent that the respective outlet check valve 304d opens and the coolant is pumped about the fluid circulation path 318. Once the second branch 308b is emptied of the coolant, such as detected by a sensor, the controller of this example embodiment deactivates the TEC device 410. While the TEC device 410 is deactivated, the coolant, after having circulated about the fluid circulation path 318, fills the first branch 308a and is heated by heat absorbed from at least one component of the mobile electronic device 100. Even though the TEC device 410 is now deactivated, the heating of the coolant in the first branch 308a causes the pressure to increase to such an extent that the respective outlet check valve 304c opens and the coolant is again pumped about the fluid circulation path 318. Upon detecting that the heated coolant is flowing out of the first branch 308a, such as by a sensor, the controller may then cause the TEC device 410 to again be activated in order to repeat the foregoing process.

This pumping process will now be further described with respect to the embodiment of FIG. 3. In such an example in which the coolant is in the first branch 308a of the fluid circulation path 318 and the second branch 308b has been evacuated of coolant, the coolant in the first branch is in thermal communication one or more components of the mobile electronic device 100. Thus, the coolant is heated in response to the transfer of heat from the one or more first components the mobile electronic device 100. For example, heat may be generated by mobile electronic device 100 during a charging process with at least some of the heat being transferred to the coolant in the first branch 308a, thereby cooling the mobile electronic device, such as the one or more first components of the mobile electronic device. Upon being heated, the coolant, whether the coolant remains in liquid form or transitions to a gaseous form, expands such that the pressure within the first branch is greater than the pressure within the fluid circulation path on the opposite side of the check valve. Thus, the outlet check valve 304c opens and the heated coolant is pumped out of the first branch 308a and about the fluid circulation path 318.

Since the check valves only permit fluid to flow in one direction, the outlet check valve 304d associated with the outlet 306d of the second branch 308b prevents the coolant from flowing into the second branch. Additionally, since the expansion of the coolant brought about by the heating of the coolant by the heat transferred from the one or more electronic components of the mobile electronic device 100 effectively pumps the coolant about the fluid circulation path 318, the TEC device 310 need not be activated while the coolant is in the first branch and in thermal communication with the one or more electronic components of the mobile electronic device. In this regard, the controller, such as embodied by the processing circuitry 202, may direct the TEC device 310 to be deactivated in response to a signal from a sensor associated with the second branch 308b indicating that the second branch has been evacuated of coolant.

Upon exiting from the first branch 308a through the outlet check valve 304c, the heated coolant flows through the outlet junction 322 and about the fluid circulation path 318. As illustrated, the coolant flowing through the fluid circulation path 318 is then in thermal communication with a heat sink 316, such as the housing of the wireless charging device 300 of FIG. 3 or another type of heat sink. The thermal communication between the coolant within the fluid circulation path 318 and the heat sink 316 cools the coolant by the transfer of heat to the heat sink which may, in turn, dissipate the heat, such as to the surrounding environment. In an instance that the coolant boiled to a vapor by heat absorbed from the one or more electronic components while the coolant is in the first branch 308a, the discharge of heat to the heat sink 316 causes the coolant to transition back into liquid form within a portion of the fluid circulation path 318 proximate the heat sink 316. It should be appreciated that in an instance the coolant was heated but remained in liquid form in the first branch 308a, the coolant is still cooled to a lower temperature by a discharge of heat to the heat sink 316.

Referring back to FIG. 3, the substantially condensed coolant then proceeds downstream of the heat sink 316 and, in the illustrated embodiment comes into thermal communication with another heated component 314, such as one or more electronic components of the charger 300. The coolant absorbs heat from the heated component 314 so as to increase the temperature of the coolant, although the coolant remains in a liquid form.

After having been heated by the heat transferred from the heated component 314, the coolant then flows about the fluid circulation path 318 to the inlet junction 320. From inlet junction 320 and based on the pressure differential across the inlet check valves 304a, 304b, the coolant flows through the inlet check valve 304b and into the second branch 308b of the fluid circulation path 318. In some embodiments, the coolant also flows through the inlet check valve 304a and into the first branch 308a such that coolant fills both the first and second branches. Prior to or upon arrival of the coolant within the second branch 308b of the fluid circulation path 318, the TEC device 310 is activated, such as in response to a control signal from the controller that may be triggered by a sensor detecting the circulation of the coolant, such that the second surface of the TEC device is heated, while the first surface of the TEC device is cooled. Thus, the coolant within the first branch 308a again absorbs heat from the mobile electronic device 100 with at least some of the heat that is absorbed being dissipated by the concurrent cooling of the coolant by the TEC device 310.

The TEC device 310 remains activated while the coolant is in the second branch 308b, thereby heating the coolant until the coolant is heated to such an extent that the pressure within the second branch sufficiently exceeds the pressure on the opposite side of the outlet check value 304d so as to cause the outlet check valve 304d to open and the coolant to flow about the fluid circulation path 318 as described above. Once the outlet check valve 304d is opened, a sensor may detect the evacuation of the second branch 308b and may signal the controller which, in turn, issues a control signal to the TEC device 310 to cause the TEC device to be deactivated. This process then repeats with the heat absorbed by the coolant from the mobile electronic device 100 and/or the TEC device 310 providing the motive force to pump the coolant about the fluid circulation path 318. As a result, both the mobile electronic device 100 and one or more heated electronic components 314 of another device, such as the wireless charger 300, are cooled by the circulating coolant.

Although described above in relation to an embodiment in which the apparatus including the fluid circulation path 318 is disposed within a device, such as a wireless charger 300, external to the mobile electronic device 100, the apparatus including the fluid circulation path may instead be disposed within the mobile electronic device as shown in FIGS. 3-5. In this example embodiment, the TEC device 410 is positioned proximate to and in thermal communication with one or more first electronic components 502, such as one or more first electronic components on PCB 404, with the first branch 308a and, in particular, the chamber of the first branch in thermal communication with the one or more first electronic components. The coolant within the first branch 308a therefore absorbs heat from and cools the one or more first electronic components 502.

In this example embodiment, the heat sink 316 may be provided by the housing of the mobile electronic device 100. As such, the fluid circulation path 318 may be formed to contact at least a portion of the housing (e.g., a phone case), such as illustrated by the manner in which a portion 316 of the fluid circulation path of FIG. 3 curves upward away from the PCB 404 and into contact with the housing (not shown). In some embodiments, at least a portion of heat sink 316 can be insulated from PCB 404, or any other component associated with mobile electronic device 100, such that heat cannot be readily transferred therebetween. For example, as shown in FIG. 3, heat sink 316 is in substantially close proximity to battery 314 and in order to prevent heat carried by the coolant to at least a portion of heat sink 316 from being transferred into battery 314, at least a layer of thermal insulation may be positioned therebetween. In some embodiments, the layer of thermal insulation, such as a layer of electrical insulation, may be disposed over at least a portion of heat sink 316 and/or battery 314. The mobile electronic device 100 of other example embodiments may include additional or different types of heat sinks 316, such as a fan that serves to move air over the fluid circulation path 318 and to extract heat from the coolant.

The apparatus of this example embodiment may also be configured to absorb heat from one or more second electronic components, downstream of the heat sink 316 from the perspective of the fluid circulation path 318. The one or more second electronic components may be one or more electronic components carried by the PCB 404, one or more discrete electronic components offboard of the PCB and/or the battery 314 or a portion of the battery of the mobile electronic device 100. In order to facilitate the transfer of heat from the one or more second components to the coolant, the portion of the fluid circulation path 318 that is proximate the heated component may have a curved or serpentine shape 402. As such, the serpentine portion 402 of the fluid circulation path 318 allows the coolant to remain in thermal contact with the one or more second components for an extended period of time which, in turn, allows for greater heat transfer, thereby more greatly cooling the one or more second components and increasing the temperature of the coolant. In an embodiment in which portions, e.g., hot spots, of the one or more second components, such as the battery 314, have a greater temperature than other portions, the fluid circulation path 318 may be routed relative to the one or more second components so as to be in thermal communication with and, in some embodiments, in physical contact with the hot spots, thereby cooling the hot spots. As such, the apparatus including the fluid circulation path 318 of this example embodiment serves to cool multiple components of the mobile electronic device 100, such as both one or more first electronic components and one or more second electronic components.

Although the embodiments of FIGS. 3-5 depict the first branch 308a of the fluid circulation path 308 to be in thermal communication with one or more electronic components 502 and another portion of the fluid circulation path to be in thermal communication with a heated component, such as a battery 314, this relationship may be reversed in other embodiments. For example, in some embodiments, the first branch 308a of the fluid circulation path 318 may be in thermal communication with the heated component, such as the battery 314, and another portion of the fluid circulation path, e.g., a serpentine portion 402 in the illustrated embodiment, may be in thermal communication with the one or more first electronic components 502. In some further embodiments, the fluid circulation path 318 may include a plurality of serpentines portions 402 positioned in parallel with each other in order to increase the heat transfer from the heated component, such as, for example, one or more of electronic components 502, battery 314, or the like, or combinations thereof.

The circulation of the coolant about the fluid circulation path 318 may continue indefinitely or an end condition may be detected, which terminates the circulation of fluid about the fluid circulation path. In this example embodiment, the end condition may be defined in various manners such as the temperature of the various sources of heat, such as the at least one first component, dropping below the minimum threshold, such as may be detected by one or more sensors (e.g., a temperature sensor). Other end conditions may comprise cessation of charging activities, an evacuation of the first and second branches 308a, 308b of the fluid circulation path 318 or the like.

The multiphase cooling mechanism, in some embodiments, can cycle the heating phase of the process between a thermoelectric couple, or another type of TEC device 310, and one or more secondary heat sources, thereby reducing power consumption. In such embodiments the TEC device 310 heats the fluid in a second branch 308b of the fluid circulation path 318 as a result of the activation of the TEC device, while one or more heat sources heat the fluid in the first branch 308a while the TEC device is deactivated. In the embodiment described above, two heat sources may cooperate to heat the fluid that flows through the first branch. For example, during a charging process (e.g. inductive charging, etc.) heat from a charger 300 (e.g., charger electronics 314, etc.) may be used to bring a coolant substantially close to its boiling temperature and heat from a mobile electronic device 100 is used to boil the coolant in the first branch 308a into a vapor. In an alternate embodiment, the position of the charger 300 and the mobile electronic device 100 may be switched with the heat from the mobile electronic device being used to bring a coolant substantially close to its boiling temperature and heat from the charger used to boil the coolant into a vapor.

In some embodiments, the charger 300 and the mobile electronic device 100 each bring coolant substantially close to, and/or past, a boiling temperature. For example, the charger 300 can be a heat source for a first branch 308a of the fluid circulation path 318 and the mobile electronic device 100 may be a heat source for a second branch 308b. In such an example, the charger 300 and mobile electronic device 100 would heat, and/or boil, the coolant of a respective branch of the fluid circulation path 318. As the charger 300 heats, and/or boils, the coolant within the first branch 308a, the mobile electronic device 100 would retain substantially more heat due to a lack of heat dissipation. However, the coolant would then cycle about the fluid circulation path 318 and into the second branch 308b. Once in the second branch 308b, the mobile electronic device 100 would transfer heat to the coolant, thereby cooling the mobile electronic device, and boiling the coolant in the second branch. During the boiling phase of the coolant in the second branch 308b, the charger 300 would retain substantially more heat. The coolant would then cycle through the fluid circulation path 318 and, again, into the first branch 308a. As such the cooling cycle could be repeated for as long as the charger 300 and mobile electronic device 100 generate heat to pump the coolant about the fluid circulation path 318. This process may result in continuous coolant flow and heat dissipation from the charger electronics 314 as well as the mobile electronic device 100.

In such embodiments, the TEC device 310 may be included and configured to initiate the multiphase cooling process and/or aid in heating the fluid within the first and/or second branches 308a, 308b. Alternatively, in some embodiments, the TEC device 310 may be excluded and the coolant flow may be initiated, maintained, and/or halted by at least heat dissipation from the charger electronics 314 and the mobile electronic device 100.

In some embodiments, the charger 300 and/or mobile electronic device 100 may be configured to regulate the charging process (e.g., inductive charging process, etc.) such that power transfer is regulated to optimize one or more alternating heating patterns so as to correspondingly optimize the flow of coolant. For example, less power may be supplied to the mobile electronic device 100, thus less heat is generated during phases in which the branch in which fluid is heated by the mobile electronic device is substantially empty. Additionally, more power may be supplied to the mobile electronic device 100, thus more heat generated, during phases in which the branch in which fluid is heated by the mobile electronic device is substantially full of coolant.

In some embodiments, additional heat sources may be utilized (e.g., a third, fourth, fifth, etc.), such as, a heating coil or the like. In some embodiments, the end condition can be detected at least partially by one or more sensor arrangements (e.g., a temperature sensor, a magnetic field sensors, etc.). Additionally, any one or more sensor arrangements may be configured into one or more sensor arrays monitoring conditions (e.g., a start or end condition) at any one or more points through the multiphase pumping mechanism, mobile electronic device 100, charger 300, or the like, or combinations thereof.

Accordingly, blocks of the flowcharts support combinations of means for performing the specified functions and combinations of operations for performing the specified functions for performing the specified functions. It will also be understood that one or more blocks of the flowcharts, and combinations of blocks in the flowcharts, can be implemented by special purpose hardware-based computer systems which perform the specified functions, or combinations of special purpose hardware and computer instructions.

In some embodiments, certain ones of the operations, methods, steps, processes, or the like, above can be modified or further amplified. Furthermore, in some embodiments, additional optional operations, methods, steps, processes, or the like, can be included. Modifications, additions, subtractions, inversions, correlations, proportional relationships, disproportional relationships, attenuation and/or amplifications to the operations above can be performed in any order and in any combination. It will also be appreciated that in instances where particular operations, methods, steps, processes, or the like, required particular hardware such hardware should be considered as part of the apparatus for any such embodiment.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions can be provided by alternative embodiments without departing from the scope of the appended claims. In this regard, for example, different combinations of elements and/or functions than those explicitly described above are also contemplated as can be set forth in some of the appended claims. Although specific terms are employed herein, they are used in a generic and descriptive sense only and not for purposes of limitation.

The invention claimed is:

1. An apparatus comprising:
   a thermoelectric cooling device having first and second opposed surfaces; and
   a fluid circulation path comprising first and second branches in thermal communication with the first and second surfaces, respectively, of the thermoelectric cooling device, wherein the fluid circulation path is configured to control flow of fluid therethrough such that the fluid alternately flows through the first and second branches, wherein a mobile electronic device and an additional heat source, different than the mobile electronic device, cooperate to heat the fluid that flows through the first branch;
   wherein the first branch is also configured to be in thermal configuration with at least one first component of the mobile electronic device in order to absorb heat and correspondingly cool the at least one first component of the mobile electronic device.

2. The apparatus of claim 1 further comprising a controller configured to activate the thermoelectric cooling device in an instance in which the fluid flows through the second branch and is in thermal communication with the second surface of the thermoelectric cooling device so as to be absorb heat from the second surface of the thermoelectric cooling device, wherein the controller is also configured to deactivate the thermoelectric cooling device in an instance in which the fluid flows through the first branch and is in thermal communication with the at least one component of the mobile electronic device.

3. The apparatus of claim 1 further comprising a heat sink in thermal communication with the fluid circulation path to permit heat from the fluid to be discharged thereto.

4. The apparatus of claim 3 wherein the fluid circulation path is also in thermal communication with a heat source positioned between the heat sink and the thermoelectric cooling device to permit heat from the heat source to be absorbed by the fluid.

5. The apparatus of claim 4 wherein the thermoelectric cooling device, the fluid circulation path and the heat sink are comprised by the mobile electronic device, and wherein the heat source with which the fluid circulation path is in thermal communication comprises at least one second component of the mobile electronic device.

6. The apparatus of claim 5 wherein the heat sink comprises a housing of the mobile electronic device.

7. The apparatus of claim 4 wherein the thermoelectric cooling device, the fluid circulation path and the heat sink are comprised by a wireless charging device configured to charge the mobile electronic device, and wherein the heat source with which the fluid circulation path is in thermal communication comprises at least one second component of the wireless charging device.

8. A method comprising:
   circulating fluid through a fluid circulation path comprising first and second branches in thermal communication with first and second opposed surfaces, respectively, of a thermoelectric cooling device, wherein respective ones of the first and second branches comprise an inlet check valve and an outlet check valve that limit flow of fluid to one direction, wherein circulating the fluid comprises controlling flow of fluid through the fluid circulation path such that the fluid alternately flows through the first and second branches; and
   absorbing heat from at least one first component of a mobile electronic device while the fluid flows through the first branch of the fluid circulation path, thereby correspondingly cooling the at least one first component of the mobile electronic device.

9. The method of claim 8 further comprising:
   activating the thermoelectric cooling device in an instance in which the fluid flows through the second branch and is in thermal communication with the second surface of the thermoelectric cooling device so as to be absorb heat from the second surface of the thermoelectric cooling device; and
   deactivating the thermoelectric cooling device in an instance in which the fluid flows through the first branch and is in thermal communication with the at least one component of the mobile electronic device.

10. The method of claim 8 further comprising discharging heat from the fluid to a heat sink in thermal communication with the fluid circulation path.

11. The method of claim 10 further comprising absorbing heat with the fluid from a heat source that is also in thermal communication with the fluid circulation path and positioned between the heat sink and the thermoelectric cooling device.

12. The method of claim 11 wherein absorbing heat from the heat source comprises heating the fluid with the fluid remaining in a liquid phase, and wherein absorbing heat from the at least one first component of the mobile electronic device comprises causing the fluid to transition to a vapor phase.

13. The method of claim 11 wherein the thermoelectric cooling device, the fluid circulation path and the heat sink are comprised by the mobile electronic device, and wherein the heat source with which the fluid circulation path is in thermal communication comprises at least one second component of the mobile electronic device.

14. The method of claim 13 wherein the heat sink comprises a housing of the mobile electronic device.

15. The method of claim 11 wherein the thermoelectric cooling device, the fluid circulation path and the heat sink are comprised by a wireless charging device configured to charge the mobile electronic device, and wherein the heat source with which the fluid circulation path is in thermal communication comprises at least one second component of the wireless charging device.

16. A computer program product comprising a non-transitory computer readable storage medium having program code portions stored thereon, the program code portions configured, upon execution, to cause an apparatus to:
cause a thermoelectric cooling device to be activated in an instance in which a fluid flows through a second branch of a fluid circulation path having first and second branches in thermal communication with first and second surfaces, respectively, of the thermoelectric cooling device, wherein respective ones of the first and second branches comprise an inlet check valve and an outlet check valve that limit flow of fluid to one direction, wherein the fluid circulation path is configured to control flow of fluid therethrough such that the fluid alternately flows through the first and second branches, and wherein activation of the thermoelectric cooling device causes the fluid within the second branch of the fluid circulation path to absorb heat from the thermoelectric cooling device; and
cause the thermoelectric cooling device to be deactivated in an instance in which the fluid flows through the first branch, wherein the first branch of the fluid circulation path is in thermal communication with at least one component of a mobile electronic device such that the fluid absorbs heat from the at least one component while the thermoelectric cooling device is deactivated.

17. The computer program product of claim 16 wherein the program code portions configured to cause the thermoelectric cooling device to be activated comprise program code portions to cause the thermoelectric cooling device to be activated so as to cause the fluid within the second branch of the fluid circulation path to absorb heat from the thermoelectric cooling device sufficient to cause the fluid to transition from a liquid state to a vapor phase.

18. The computer program product of claim 16 wherein the program code portions configured to cause the thermoelectric cooling device to be deactivated comprise program code portions to cause the thermoelectric cooling device to be deactivated while heat from the at least one component of the mobile electronic device is absorbed by the fluid within the first branch of the fluid circulation path that is sufficient to cause the fluid to transition from a liquid state to a vapor phase.

19. The computer program product of claim 16 wherein the thermoelectric cooling device and the fluid circulation path are comprised by the mobile electronic device.

20. The computer program product of claim 16 wherein the thermoelectric cooling device and the fluid circulation path are comprised by a wireless charging device.

* * * * *